(12) United States Patent
Rewienski et al.

(10) Patent No.: US 8,091,052 B2
(45) Date of Patent: Jan. 3, 2012

(54) OPTIMIZATION OF POST-LAYOUT ARRAYS OF CELLS FOR ACCELERATED TRANSISTOR LEVEL SIMULATION

(75) Inventors: Michal J Rewienski, San Francisco, CA (US); Kevin J Kerns, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 1011 days.

(21) Appl. No.: 11/932,352

(22) Filed: Oct. 31, 2007

(65) Prior Publication Data

US 2009/0113356 A1 Apr. 30, 2009

(51) Int. Cl.
*G06F 9/455* (2006.01)
*G06F 17/50* (2006.01)
(52) U.S. Cl. ........................................ 716/106; 716/111
(58) Field of Classification Search ............ 716/2, 8–11, 716/106, 111
See application file for complete search history.

(56) References Cited

U.S. PATENT DOCUMENTS 6,487,703 B1 * 11/2002 McBride et al. .................. 716/4
7,392,170 B1 * 6/2008 McGaughy et al. ............. 703/14
2006/0259883 A1 * 11/2006 Cohen et al. ..................... 716/5
2007/0157135 A1 * 7/2007 Yang ................................. 716/4
2008/0133201 A1 * 6/2008 Guedon ........................... 703/14

OTHER PUBLICATIONS

Kao et al.; "Parasitic Extraction: Current State of the Art and Future Trends"; May 2001; Proceedings of the IEEE, vol. 89, No. 5; pp. 729-739.*
Zhang et al.; "A Synthesis Flow Toward Fast Parasitic Closure for Radio-Frequency Integrated Circuits"; Jun. 2004; ACM; pp. 155-158.*
Agarwal et al.; "Accurate Estimation of Parasitic Capacitances in Analog Circuits"; Mar. 2004; IEEE; pp. 1-2.*
Dagilo et al.; "Building the Hierarchy from a Flat Netlist for a Fast and Accurate Post-Layout Simulation with Parasitic Components"; Mar. 2004; pp. 1-2.*
Kamon et al.; "Interconnect Parasitic Extraction in the Digitial IC Design Methodology"; Nov. 1999; IEEE; pp. 222-230.*
Kerns et al.; "Stable and Efficient Reduction of Substrate Model Networks Using Congruence Transforms"; Nov. 1995; Department of Electrical Engineering, University of Washington; pp. 1-8.*

\* cited by examiner

*Primary Examiner* — Suresh Memula
(74) *Attorney, Agent, or Firm* — Fenwick & West LLP

(57) ABSTRACT

A method for optimizing post-layout array for accelerated transistor level simulation is provided. In some embodiments of the present invention, a post-layout array of cells having a plurality array lines is optimized by forming array line models for the array lines of the post-layout array of cells. Ideal sub-arrays are formed with the cells of the post-layout array. The ideal sub-array can be simulated using conventional techniques such as HAR or SOFA. Furthermore, some embodiments of the present invention also detect and optimize parasitic capacitors to facilitate formation of the ideal sub-arrays.

23 Claims, 6 Drawing Sheets

OPTIMIZATION OF POST-LAYOUT ARRAYS OF CELLS FOR ACCELERATED TRANSISTOR LEVEL SIMULATION

BACKGROUND

1. Field of the Invention

The invention relates to the design and testing of integrated circuits. More specifically, the invention relates to a method and an apparatus performing simulation of post-layout arrays of cells in integrated circuits.

2. Related Art

As the complexity, density, and operating frequencies of integrated circuits have increased, simulation of integrated circuits have become critical for ensuring the functionality of integrated circuits. However, due to the increased complexity, simulation of integrated circuits requires enormous computing resources and time. To reduce the resource and time requirements of simulation various techniques have been developed to increase the efficiency of simulating certain categories of circuits. In particular, arrays of cells, such as memory arrays, display matrices (e.g. LCDs), would require extensive computing resources and time to simulate.

FIG. 1(a) is a simplified circuit diagram of a typical pre-layout array of cells 100. In particular, pre-layout array of cells 100 shown in includes cells C11 to C66, vertical array lines VAL1 to VAL6, and horizontal array lines HAL1 to HAL6. Cells C11 to C66 are arranged in rows and columns, where a cell CXY is in the Yth row (starting at the bottom) and Xth column (starting from the left side) of pre-layout array of cells 100. As used herein pre-layout circuits are circuits derived from the design file without information regarding the planned physical implementation of the circuits. Post-layout circuits include information about the planned physical implementation of the circuit and thus would include information regarding sizing, spacing, and placement of the elements of the circuit as well as parasitic elements (such as parasitic capacitors and parasitic resistors) that may arise due to the physical implementation. Horizontal array lines HAL1 to HAL6 extend from the left side of pre-layout array of cells 100 to the right side of pre-layout array of cells 100, with each horizontal array line HALY being located below the Yth row of cells. Conversely, vertical array lines VAL1 to VAL6 extend from the bottom of pre-layout array of cells 100 to the top of pre-layout array of cells 100, with each vertical array line VALX being located to the left of the Xth column of cells. Each cell CXY is coupled to vertical array line VALX and horizontal array line HALY. Thus, for example cell C34 is coupled to vertical array line VAL3 and to horizontal array line HAL4. Similarly, cell C52 is coupled to horizontal array line HAL2 and vertical array line VAL5. If pre-layout array of cells 100 were a memory array, the cells would be memory cells, horizontal array lines would be word lines, and vertical array lines would be bit lines. In many array of cells multiple horizontal array lines or vertical array lines may be used for a single column or row of cells. For example, some memory arrays would have two bit lines per column of cells. In addition to vertical or horizontal, array lines are also classified herein as externally driven array lines or internally driven array lines. Signals on externally driven array lines originate from outside the array of cells. For example, word lines in a memory array would be classified as externally driven array lines. Signals on internally driven array lines originate from within the array of cells. For example, bit lines in a memory array would be classified as internally driven array lines. However, in one embodiment of the present invention, array lines that are only capacitively coupled to the cells are classified as externally driven lines while all other array lines are classified as internally driven array lines. For clarity, the arrays of cells described herein only include a limited number of cells (e.g. 36 cells in pre-layout array of cells 100); however, in actual circuit designs arrays of cells may include thousands or millions of cells.

Techniques such as hierarchical array reduction (HAR) found in Nanosim (a circuit simulator available from Synopsys) and spice optimized for arrays (SOFA) found in XA (a circuit simulator available from Synopsys) can be used to accelerate simulations of arrays of cells. Generally, these techniques take advantage of the repetitive and hierarchical nature of arrays of cells. Thus, these techniques can only be used if each cell of the array of cells is exactly identical and if the array lines are "ideal". Ideal array lines would have negligible series resistance and series capacitances and thus can be treated as a single node. Therefore, in general, techniques such as HAR and SOFA are only effective for simulation of pre-layout arrays.

However, with increased density and higher operating frequencies in integrated circuits, line parasitic capacitances and resistances are no longer negligible. Thus, a simple pre-layout array of cells (such as pre-layout array of cells 100) becomes a much more complicated post-layout array of cells due to the parasitic capacitances and resistances that should be included in the simulation to provide accurate simulation of the post-layout array of cells. FIG. 1(b) is a simplified circuit diagram of a post-layout array of cells 150. Post-layout array of cells 150 again includes cells C11 to C66, horizontal array lines HAL1 to HAL6, and vertical array lines VAL1 to VAL6. Furthermore, post-layout array of cells 150 includes various parasitic resistors and parasitic capacitors. Due to the parasitic resistors and parasitic capacitors, the array lines of post-layout array of cells 150 are distributed RC array lines rather than nodes.

Specifically, each horizontal array line HALY includes horizontal resistors HR1Y to HR6Y in series and horizontal capacitors HC1Y to HC6Y coupled between horizontal array line HALY and ground. Specifically, horizontal resistors HR1Y to HR6Y are coupled in series in horizontal array line HALY. Cell C1Y is coupled to horizontal array line HALY in between horizontal resistors HR1Y and HR2Y; Cell C2Y is coupled to horizontal array line HALY in between horizontal resistors HR2Y and HR3Y; Cell C3Y is coupled to horizontal array line HALY in between horizontal resistors HR3Y and HR4Y; Cell C4Y is coupled to horizontal array line HALY in between horizontal resistors HR4Y and HR5Y; Cell C5Y is coupled to horizontal array line HALY in between horizontal resistors HR5Y and HR6Y; and Cell C6Y is coupled to horizontal array line HALY in after horizontal resistor HR6Y. Horizontal capacitor HC1Y is coupled to horizontal array line HALY between cell C1Y and horizontal resistor HR2Y; horizontal capacitor HC2Y is coupled to horizontal array line HALY between cell C2Y and horizontal resistor HR3Y; horizontal capacitor HC3Y is coupled to horizontal array line HALY between cell C3Y and horizontal resistor HR4Y; horizontal capacitor HC4Y is coupled to horizontal array line HALY between cell C4Y and horizontal resistor HR5Y; horizontal capacitor HC5Y is coupled to horizontal array line HALY between cell C5Y and horizontal resistor HR6Y; and horizontal capacitor HC6Y is coupled to horizontal array line HALY after cell C6Y.

Each vertical array line VALX includes vertical resistors VRX1 to VRX6 in series and vertical capacitors VCX1 to VCX6 coupled between vertical array line VALX and ground. Specifically, vertical resistors VRX1 to VRX6 are coupled in series in vertical array line VALX. Cell CX1 is coupled to vertical array line VALX in between vertical resistors VRX1 and VRX2; Cell CX2 is coupled to vertical array line VALX in between vertical resistors VRX2 and VRX3; Cell CX3 is coupled to vertical array line VALX in between vertical resistors VRX3 and VRX4; Cell CX4 is coupled to vertical array line VALX in between vertical resistors VRX4 and VRX5; Cell CX5 is coupled to vertical array line VALX in between vertical resistors VRX5 and VRX6; and Cell CX6 is coupled to vertical array line VALX after vertical resistor VRX6. Vertical capacitor VCX1 is coupled to vertical array line VALX between cell CX1 and vertical resistor VRX2; vertical capacitor VCX2 is coupled to vertical array line VALX between cell CX2 and vertical resistor VRX3; vertical capacitor VCX3 is coupled to vertical array line VALX between cell CX3 and vertical resistor VRX4; vertical capacitor VCX4 is coupled to vertical array line VALX between cell CX4 and vertical resistor VRX5; vertical capacitor VCX5 is coupled to vertical array line VALX between cell CX5 and vertical resistor VRX6; and vertical capacitor VCX6 is coupled to vertical array line VALX after cell CX6.

The parasitic capacitors and resistors illustrated in FIG. 1(b) are used for illustrative purposes. In an actual post-layout array of cells, many more parasitic resistances and capacitances may be present. For example, an array of cells in an actual circuit design may include millions of parasitic elements. Furthermore, the values of the various parasitic capacitors and parasitic resistors can vary. Thus, even though post-layout array of cells 150 is drawn with a regular consistent arrangement, actual post-layout arrays of cells are irregular and inconsistent due to the differing arrangements and values of the parasitic capacitors and resistors. Furthermore, due to the parasitic resistors and capacitors the array lines can not be treated as single nodes. In addition to the parasitic capacitors from array lines to ground, parasitic coupling (i.e. parasitic capacitors) occur between array lines (due to space constraint these parasitic couplings are not shown in FIG. 3). Thus, the conventional techniques to efficiently simulate arrays of cells, such as Nanosim's HAR and SOFA can not be used on post-layout arrays of cells. Hence there is a need for a method and apparatus for efficiently simulating post-layout arrays of cells.

SUMMARY

Accordingly, the present invention provides a method to optimize post-layout arrays of cells to allow accelerated transistor level simulation of the post-layout arrays of cells. The post-layout array of cells includes a plurality of cells and a plurality of array lines. Array line models are formed from the array lines and ideal-sub arrays are formed from the cells of the post-layout array of cells. The ideal sub-arrays can be simulated using conventional fast array simulation techniques such as HAR and SOFA.

In one embodiment of the present invention array line models are formed by extracting the resistances on the array line, the capacitances on the array line, the capacitance of the drivers of the array line, and the driver strengths of the drivers of the array line. Model order reduction techniques are applied to the extracted information to form the array line models. The array line models can be further enhanced by extracting the capacitances for each cell on the array line and including the capacitances from the cells in the array line models.

In one embodiment of the present invention, formation of the ideal sub arrays involves ordering the cells on internally driven array lines by a distance measure, such as delay from an external circuit to each cell or topological distance from the external circuit to each cell. Then the delay from the cells on each internally driven array line to an external circuit coupled to the internally driven array line is computed. Furthermore, the delay from the driver of each externally driven array line to each cell on the externally driven array line is also computed. The cells that have similar delay are regrouped and reconnected to nodes on the array lines. Cells connected to the same node and having identical cell structures that form arrays of a minimum size are classified as ideal sub arrays.

Furthermore, many embodiments of the present invention include parasitic capacitor detection and optimization. Specifically, parasitic capacitors are optimized by replacing parasitic capacitors between a first element and a second element with a first capacitor coupled between the first element and ground and a second capacitor coupled between the second element and ground.

The present invention will be more fully understood in view of the following description and drawings.

DETAILED DESCRIPTION

Figure 1A:
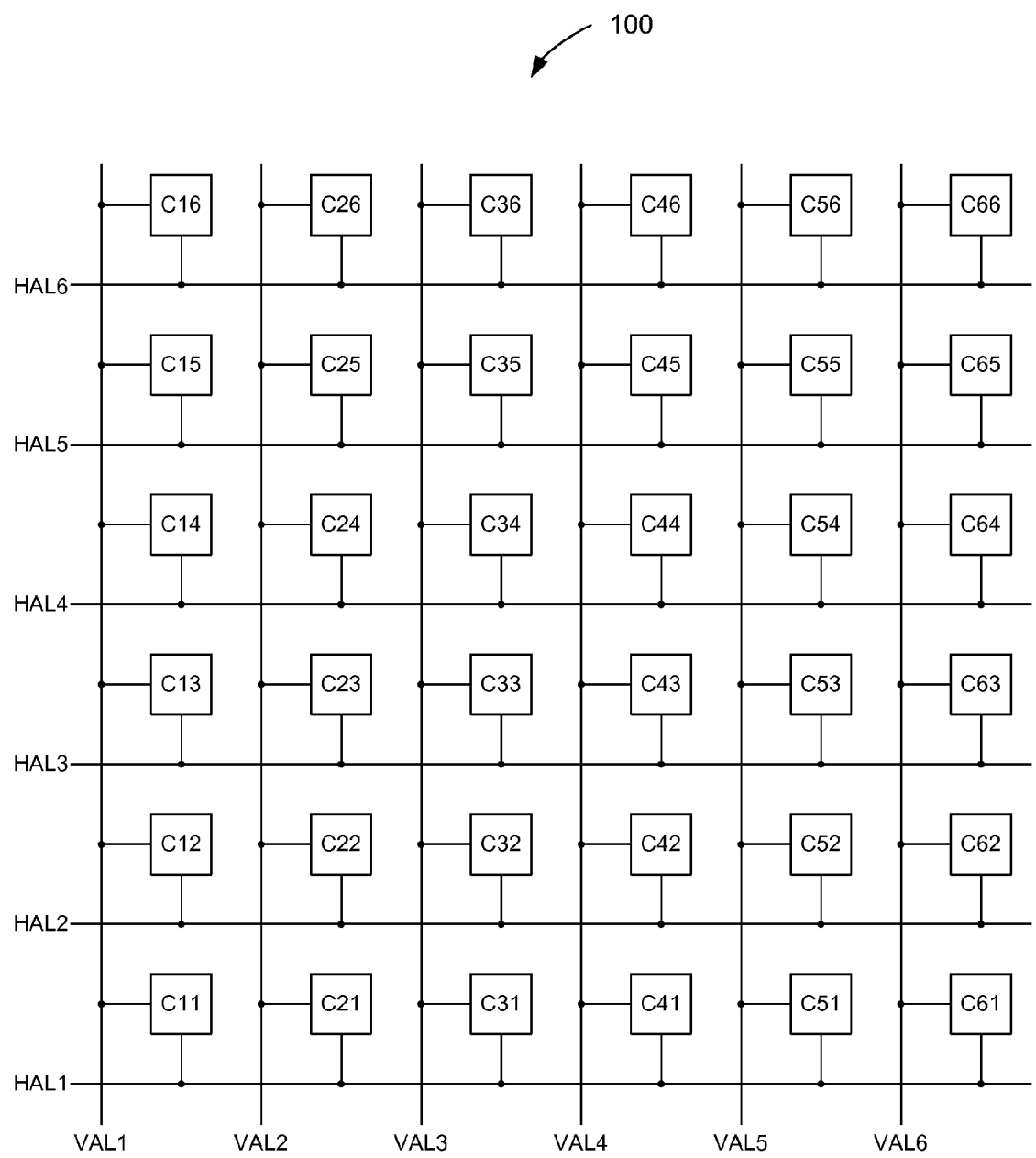
FIG. 1(a) is a simplified circuit diagram of a pre-layout array of cells of an integrated circuit.
Figure 1B:
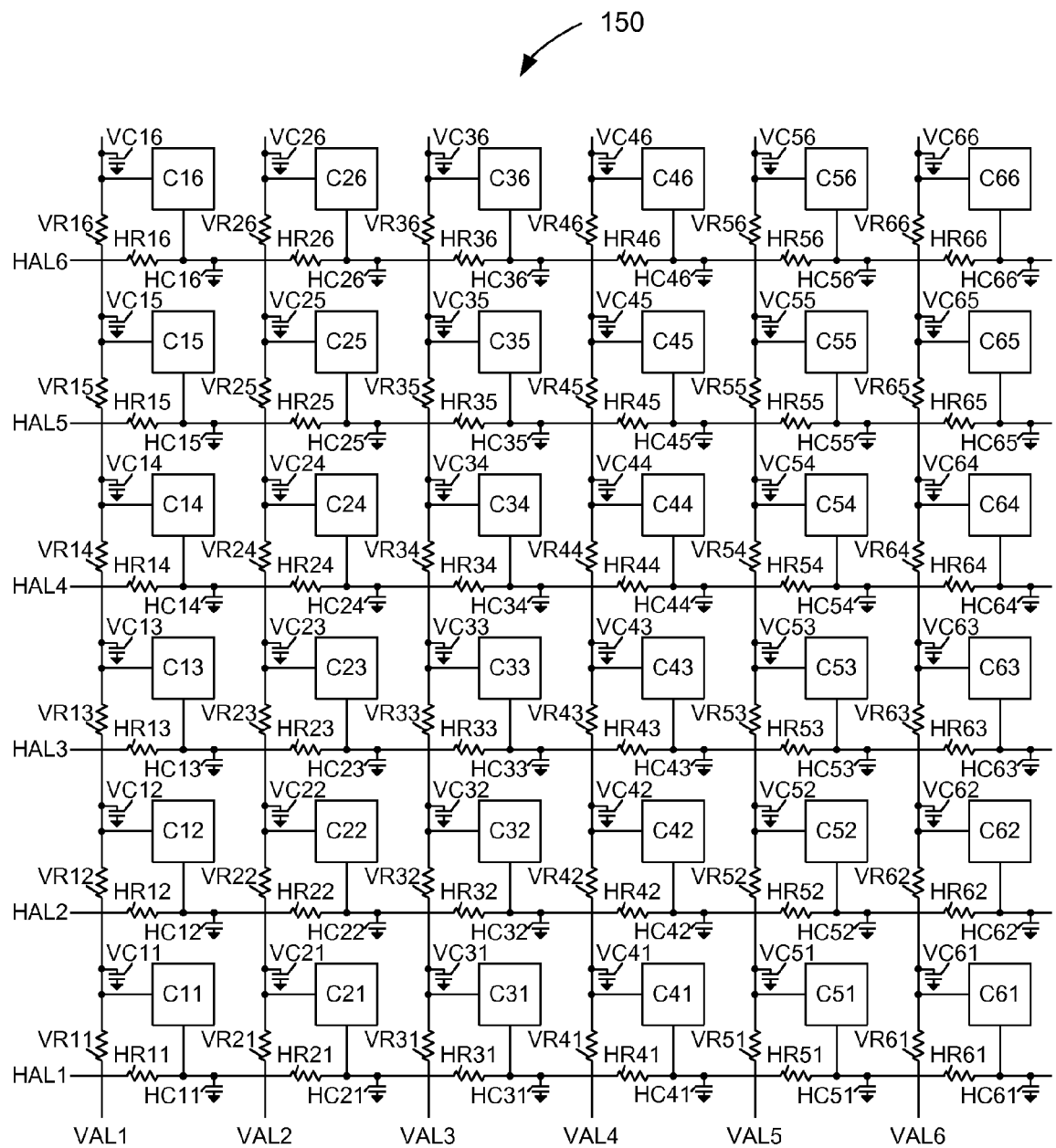
FIG. 1(b) is a simplified circuit diagram of a post-layout array of cells of an integrated circuit.
Figure 2:
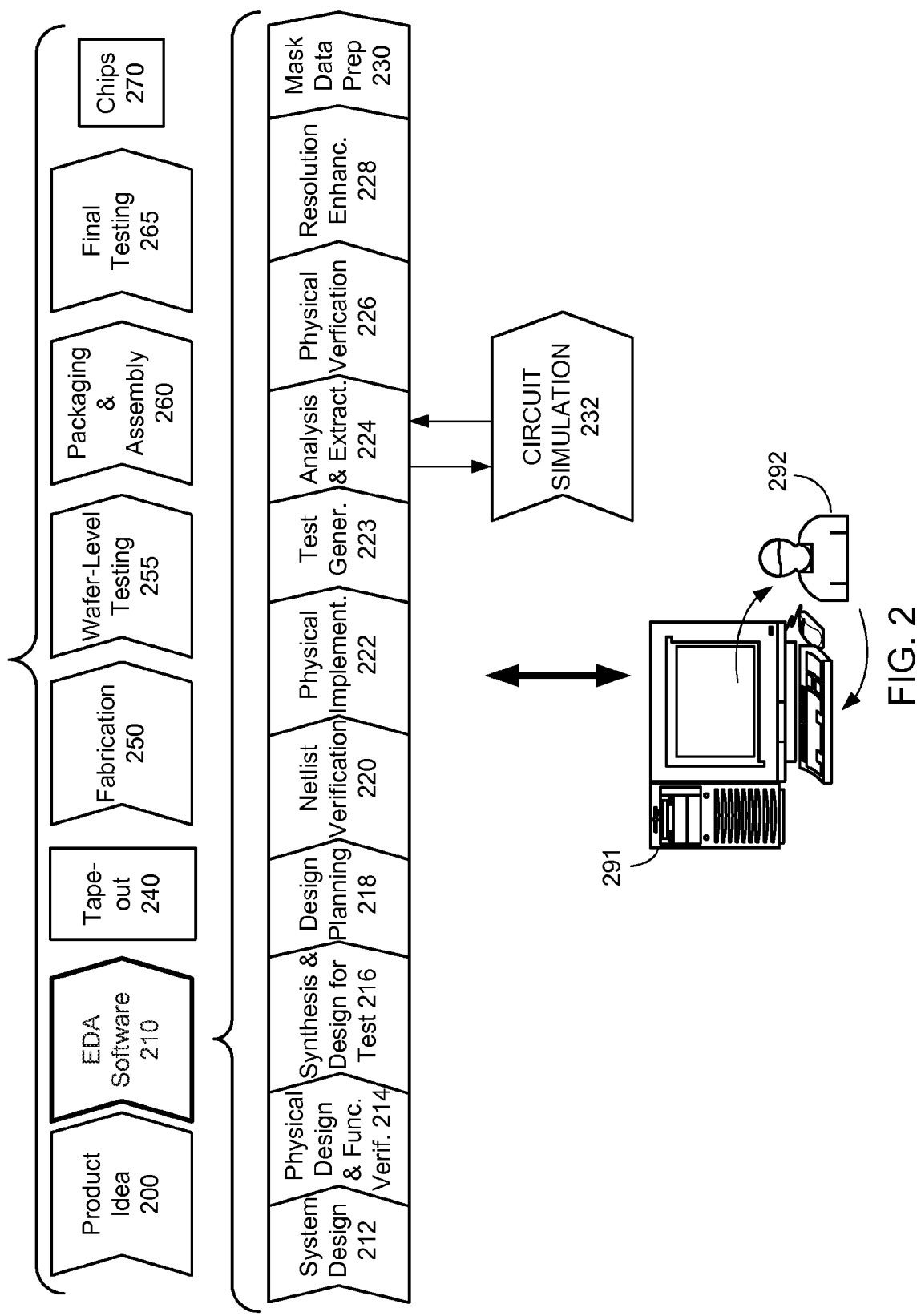
FIG. 2 is a simplified representation of an exemplary digital IC design flow in accordance with one embodiment of the present invention.

It may be helpful to place the processes of this invention in context of the overall chip design. FIG. 2 shows a simplified representation of an exemplary digital IC design flow. At a high level, the process starts with the product idea (200) and is realized in an EDA software design process (210). When the design is finalized, it can be taped-out (event 240). After tape out, the fabrication process (250) creates wafers containing the IC. Wafer level testing (255) can be performed to detect and remove defective wafers (or dies). Then the non-defective dies are packaged and assembled in a packaging and assembly processes (260). Final testing (265) of the packaged IC is a final quality control process to remove any defective products. Packaged ICs that pass the final test result in the finished chips (270) that are delivered to consumers of the IC.

The EDA software design process (210) is actually composed of a number of stages 212-230, shown in linear fashion for simplicity. EDA software 210 and its stages are typically stored in a computer readable medium (e.g. hard disks, DVDs), for use on a computer 291 by a user 292. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC. A brief description of the components of the EDA software design process (stage 210) will now be provided.

System design (stage 212): The circuit designers describe the functionality that they want to implement, they can per-form what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 214): At this stage, the VHDL or Verilog code for modules in the system is written and the design (which may be of mixed clock domains) is checked for functional accuracy. More specifically, the design is checked to ensure the design produces the correct outputs. Exemplary EDA software products from Synopsys, Inc. that can be used at this stage include VCS, VERA, DesignWare®, Magellan, Formality, ESP and LEDA products.

Synthesis and design for test (stage 216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 218): Here, an overall floorplan for the chip is constructed and analyzed for timing and top-level routing. Exemplary EDA software products from Synopsys, Inc. that can be used at this stage include Jupiter and Flooplan Compiler products. Although circuitry and portions thereof (such as standard cells) are described herein as if they exist in the real world, it is to be understood that at this stage only a computer model exists in a programmed computer. The actual circuitry in the real world is created after this stage.

Netlist verification (stage 220): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 222): The placement (positioning of circuit elements) and routing (connection of the same) occurs at this step. Exemplary EDA software products from Synopsys, Inc. that can be used at this stage include the Astro and IC Compiler product.

Test Generation (stage 223): Automatic Test Pattern Generation is performed on the design and the test patterns are formatted for automatic test equipment. Exemplary EDA software products from Synopsys Inc. that can be used at this stage include the TetraMAX product.

Analysis and extraction (stage 224): At this step, the circuit function is verified at a transistor level, this in turn permits what-if refinement. Moreover, the analysis tools in this stage 224 produce data indicative of the effect of circuit elements on various design-specific attributes, such as timing, signal integrity, power, and electromigration. Circuit simulation 232 forms a subset of the functions performed in Analysis and extraction (stage 224). Exemplary EDA software products from Synopsys, Inc. that can be used at this include Star RC/XT, Raphael, Aurora, PrimeTime products, HSPICE, Nanosim, HSIM and XA.

Physical verification (stage 226): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 228): This stage involves geometric manipulations of the layout to improve manufacturability of the design. Exemplary EDA software products from Synopsys, Inc. that can be used at this stage include iN-Phase, Proteus, and AFGen products.

Mask data preparation (stage 230): This stage provides the "tape-out" data for production of masks for lithographic use to produce finished chips. Exemplary EDA software products from Synopsys, Inc. that can be used at this stage include the CATS(R) family of products.

The present invention is used during circuit simulation 232. Specifically, the present invention allows optimization of a post-layout array of cells into an optimized array of cells. Furthermore, embodiments of the present invention can be automated to allow automatic optimization of post-layout array of cells into optimized array of cells. The optimized array of cells includes ideal sub-arrays that can be simulated using conventional techniques for pre-layout arrays, such as HAR and SOFA.

Figure 3:
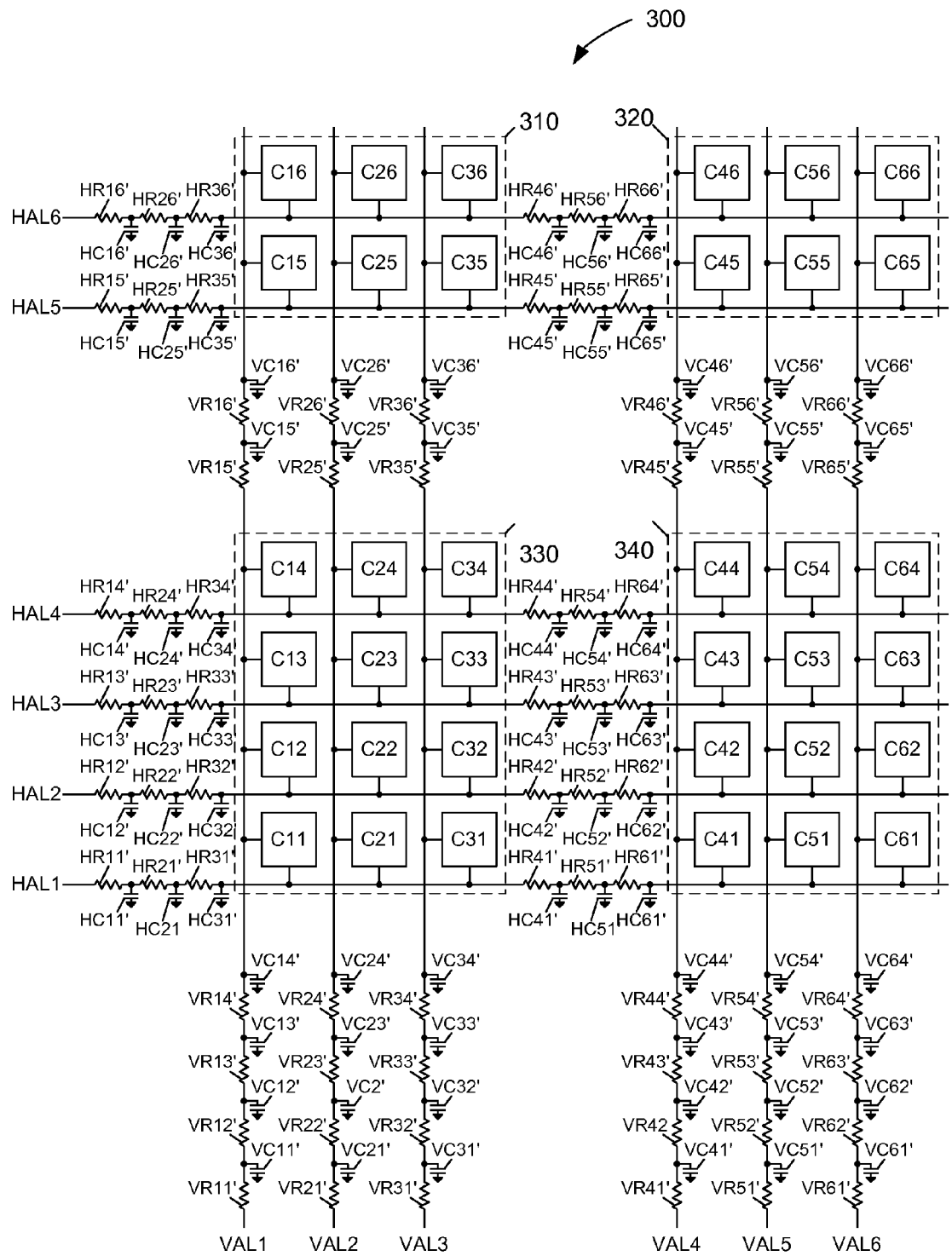
FIG. 3 is a simplified circuit diagram of an optimized post-layout array of cells used to illustrate the present invention.

FIG. 3 is a simplified circuit diagram of an optimized array of cells 300, which is obtained from initial post-layout array of cells 150 using embodiments of the present invention described below with respect to FIGS. 4 and 5. Optimized array of cells 300 includes four ideal sub-arrays 310, 320, 330, and 340. In an ideal sub-array, each cell is identical. Furthermore, array lines of the sub-array (hereinafter called sub-array lines) have negligible resistances and capacitances and can be treated as singe nodes. Thus, conventional techniques (such as SOFA and HAR) can be used to accelerate simulation of the sub-arrays.

Specifically, as illustrated in FIG. 3, sub-array 310 includes cells C16, C26, C36, C15, C25, and C35; sub-array 320 includes cells C46, C56, C66, C45, C55, and C65; sub-array 330 includes cells C14, C24, C34, C13, C23, C33, C12, C22, C23, C11, C21, and C31; and sub-array 340 includes cells C44, C54, C64, C43, C53, C63, C42, C52, C62, C41, C51, and C61. The formation of the sub-arrays is based on an analysis of the parasitic resistances and capacitances. During the analysis, some of the parasitic capacitors and resistors may be negligible; others may be adequately approximated using capacitances or resistances outside the sub-arrays or equivalent mathematical models in such a way so that signal delays between cells and array line drivers/receivers are accurately approximated according to a user specified accuracy. Furthermore, some embodiments of the present invention may even extract capacitances and resistances within the cells and modify the resistances and capacitances on the array lines to preserve distributed capacitive loads and resistances. Thus, the resistors, capacitors, or equivalent mathematical models in optimized array of cells 300 will differ from the resistances and capacitors originally found in post-layout array of cells 150. Thus, the resistors and capacitors of optimized array of cells 300 are located in different portions of the array lines and have different values as compared to post-layout array of cells 150.

Thus, in the embodiment of FIG. 3, horizontal array lines HAL6 has horizontal resistors HR16' to HR36' coupled in series prior to sub-array 310. Horizontal resistors HR46' to HR66' are coupled in series between sub-array 310 and sub-array 320. Furthermore, horizontal capacitors HC16' to HC66' are coupled between ground and horizontal array line HAL6 after horizontal resistors HR16' to HR66', respectively. Similarly, horizontal array lines HAL5 has horizontal resistors HR15' to HR35' coupled in series prior to sub-array 310. Horizontal resistors HR45' to HR65' are coupled in series between sub-array 310 and sub-array 320. Furthermore, horizontal capacitors HC15' to HC65' are coupled between ground and horizontal array line HAL5 after horizontal resistors HR15' to HR65', respectively. Each of horizontal array lines HALL to HAL4 has horizontal resistors HR1Y' to HR3Y' (for Y=1 to 4) coupled in series prior to sub-array 330 and horizontal resistors HR4Y' to HR6Y' coupled in series between sub-array 330 and sub-array 340. Furthermore, each of horizontal array lines HAL1 to HAL4 has horizontal capacitors HC1Y' to HC6Y' coupled between ground and horizontal array line HALY after horizontal resistors HR1Y' to HR6Y', respectively.

Each of vertical array lines VAL1 to VAL3 has vertical resistors VRX1' to VRX4' (for X=1 to 4) coupled in series prior to sub-array 330 and vertical resistors VRX5' to VRX6' coupled in series between sub-array 330 and sub-array 310. Furthermore, each of vertical array lines VAL1 to VAL3 has vertical capacitors VCX1' to VCX6' coupled between ground and vertical array line VALX after vertical resistors VRX1' to VRX6', respectively. Similarly, Each of vertical array lines VAL4 to VAL6 has vertical resistors VRX1' to VRX4' (for X=1 to 4) coupled in series prior to sub-array 340 and vertical resistors VRX5' to VRX6' coupled in series between sub-array 340 and sub-array 320. Furthermore, each of vertical array lines VAL4 to VAL6 has vertical capacitors VCX1' to VCX6' coupled between ground and vertical array line VALX after vertical resistors VRX1' to VRX6', respectively.

Although optimized array of cells 300 is shown with every cell being a member of an ideal sub-array, in many actual circuit designs some cells of the post-layout array of cells would not be mapped into an ideal array. Thus, in general, simulation of optimized arrays of cells would involve using techniques (such as SOFA and HAR) for fast simulation of ideal sub-arrays along with standard techniques (such as Newton-Raphson engines, non-linear equation solvers, backward and/or forward Euler integration schemes, and linear system solvers) available in simulation tools such as Nanosim, HSIM, and XA to simulate components and individual cells that are not mapped into idealized sub-arrays.

Figure 4:
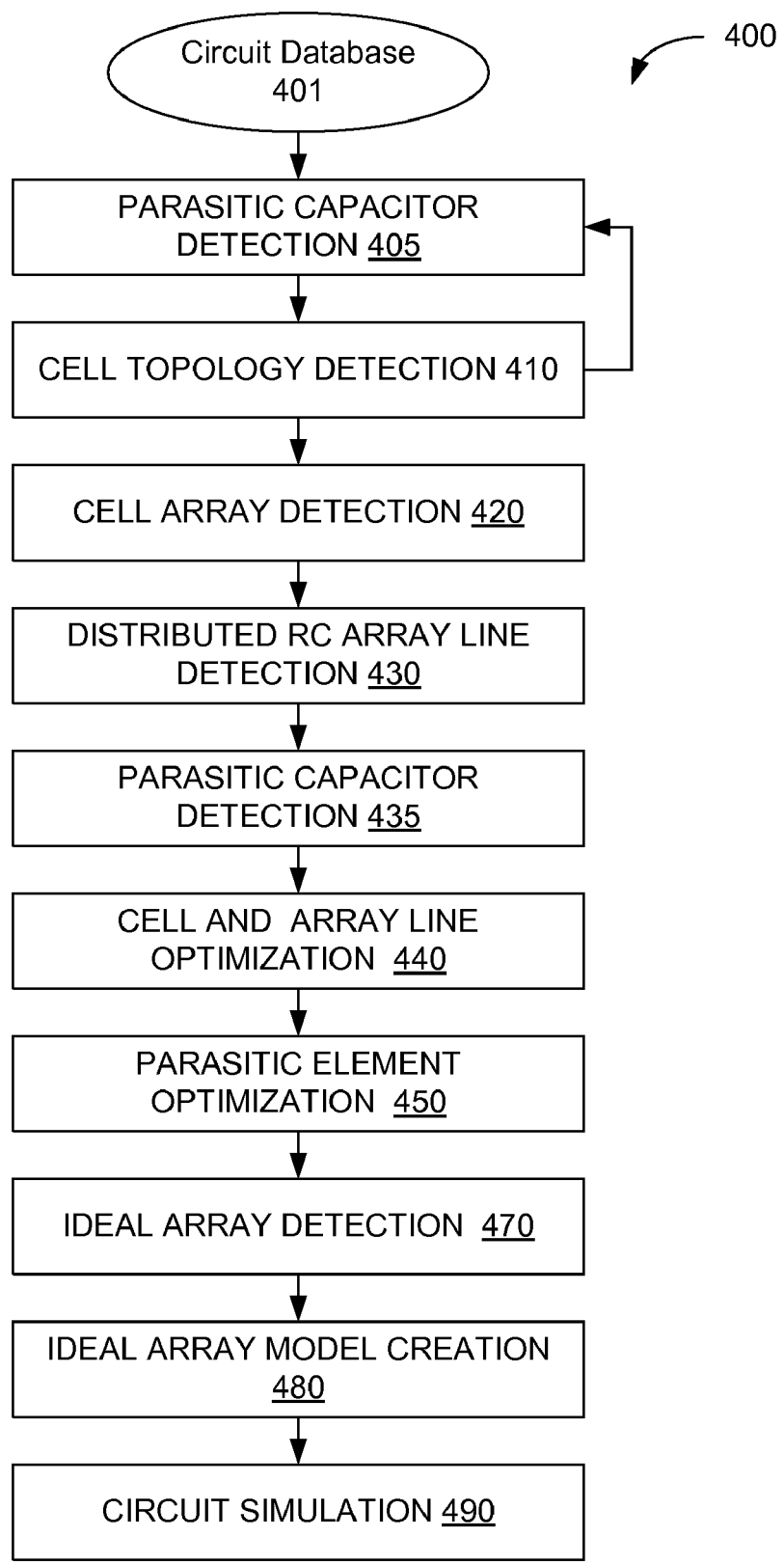
FIG. 4 is a flow chart for one embodiment of the present invention.

FIG. 4 is a flow chart 400 illustrating an embodiment of the present invention for creating optimized arrays of cells from the arrays within a post-layout circuit design 401. First an optional step for detecting parasitic capacitors can be performed in PARASITIC CAPACITOR DETECTION 405. Specifically, capacitors are categorized as either coupling capacitors or parasitic capacitors. Generally, coupling capacitors provide strong coupling between elements. Thus, elements connected by coupling capacitors should are generally grouped together during CELL TOPOLOGY DETECTION 410 (described below). However, if parasitic capacitors are mistaken for coupling capacitors the unnecessary grouping may introduce excessive errors in the identifying of the cell topologies. In one embodiment of the present invention, the capacitance of a net, which is a group of strongly resistively connected nodes, is computed. Each capacitor coupled to the net is classified as a parasitic capacitor if the capacitance of the capacitor is less than a parasitic capacitance threshold (percentage) of the total capacitance on the net. Typically the parasitic capacitance threshold is 1 to 10%, however higher parasitic capacitance threshold are generally used for identification of cell arrays. Some embodiments have used a parasitic capacitance threshold as high as 100%. Capacitors that are coupled to the net having a capacitance smaller than the parasitic capacitance threshold of the total capacitance on the net are classified as parasitic capacitors. In a specific embodiment of the present invention, a parasitic threshold capacitance of 100% is used in a first pass followed by second pass with a parasitic threshold capacitance of 50%. In other embodiments of the present invention, a user definable simulation accuracy level is provided. The simulation accuracy level is then converted into a parasitic capacitance threshold. In a particular embodiment of the present invention, parasitic capacitance accuracy levels of 3, 4, 5, 6 is translated to 10%, 3.75%, 2.5%, and 0.3% parasitic capacitance thresholds, respectively. In this embodiment accuracy levels of 1 and 2 are not used. Furthermore, in some embodiments of the present invention, a parasitic capacitor optimization is performed so that a parasitic capacitor that is coupled between a first element and a second element is replaced by a first parasitic capacitor between the first element and ground and a second parasitic capacitor between the second element and ground.

After PARASITIC CAPACITOR DETECTION 405, the topologies of potential array cells are detected using conventional means in CELL TOPOLOGY DETECTION 410. Multiple passes of PARASITIC CAPACITOR DETECTION 405 and CELL TOPOLOGY DETECTION 410 may be used with differing levels of parasitic capacitance threshold to substantiate the topology of potential array cells.

Once the cells topology is determined, arrays of cells within circuit design 401 are detected in CELL ARRAY DETECTION 420 using conventional means. In general, the connection between potential array cells and nets are analyzed to determine if there are 2-dimension arrays of at least 4×4 cells. All outside cell connections are considered for common nets with other potential cells. Then the distributed RC array lines of the arrays of cells within circuit design are detected in DISTRIBUTED RC ARRAY LINE DETECTION 430. Information regarding the resistance and the capacitance on the distributed RC array lines as well as connectivity data for cells and the array line drivers are also extracted during DISTRIBUTED RC ARRAY LINE DETECTION 430. One concern during DISTRIBUTED RC ARRAY LINE DETECTION 430 is that power lines may be misidentified as array lines. However this concern can usually be avoided because power lines would be coupled to all the cells of an array of cells while actually array lines are generally only coupled to one column of cells or one row of cells. Alternatively power lines may be identified in other ways. For example, power lines can be detected by examining the elements connected to a line. Specifically, power lines are likely to be connected to a large number of transistor bulks, ideal voltage/current sources, vector input or VCD elements.

Another optional step of detecting parasitic capacitors can be performed in PARASITIC CAPACITOR DETECTION 435 in the same manner as described above with respect to PARASITIC CAPACITOR DETECTION 405. Then in CELL AND ARRAY LINE OPTIMIZATION 440, the cells in the arrays of cells are reconnected and grouped to facilitate detection of ideal sub-arrays described in more details below and illustrated with the flow chart of FIG. 5.

Then in PARASITIC ELEMENT OPTIMIZATION 450, conventional model order reduction techniques, such as Krylov subspace approximation and truncated balanced realization (using projection matrices), are used to optimize the parasitic elements. Some embodiments may use multiple techniques in series to achieve greater optimization. Correlations between driver nodes can be computed using these techniques to find nodes which behave "identically" within specified accuracy limits. These "identical" nodes can be merged. The optimization may include merging driver nodes in RC groups and optimizing capacitive coupling between distributed RC lines. After optimizing the parasitic elements, models for the distributed RC array lines are formed from the parasitic elements.

Ideal arrays are detected in IDEAL ARRAY DETECTION 470 using conventional techniques. In general, the connection between potential array cells and nodes are analyzed to determine if there are 2-dimensional arrays with at least K rows and L columns. In a particular embodiment of the present invention K is equal to 4 and L is equal to 4. Furthermore, the cells must be identical to each other. Then, models for the Ideal arrays are created in IDEAL ARRAY MODEL CREATION 480. The exact IDEAL array models are dependent upon the modeling techniques that will be used to simulate the array. For example, SOFA models are used for SOFA simulation and HAR models would be used for HAR simulation. Simulation of the circuit using the distributed RC array line models and the ideal array models is performed in CIRCUIT SIMULATION 490. Because CIRCUIT SIMULATION 490 is able to make use of ideal array models rather than simulating each cell separately, simulation using the principles of the present invention is less time consuming than conventional simulation techniques.

Figure 5:
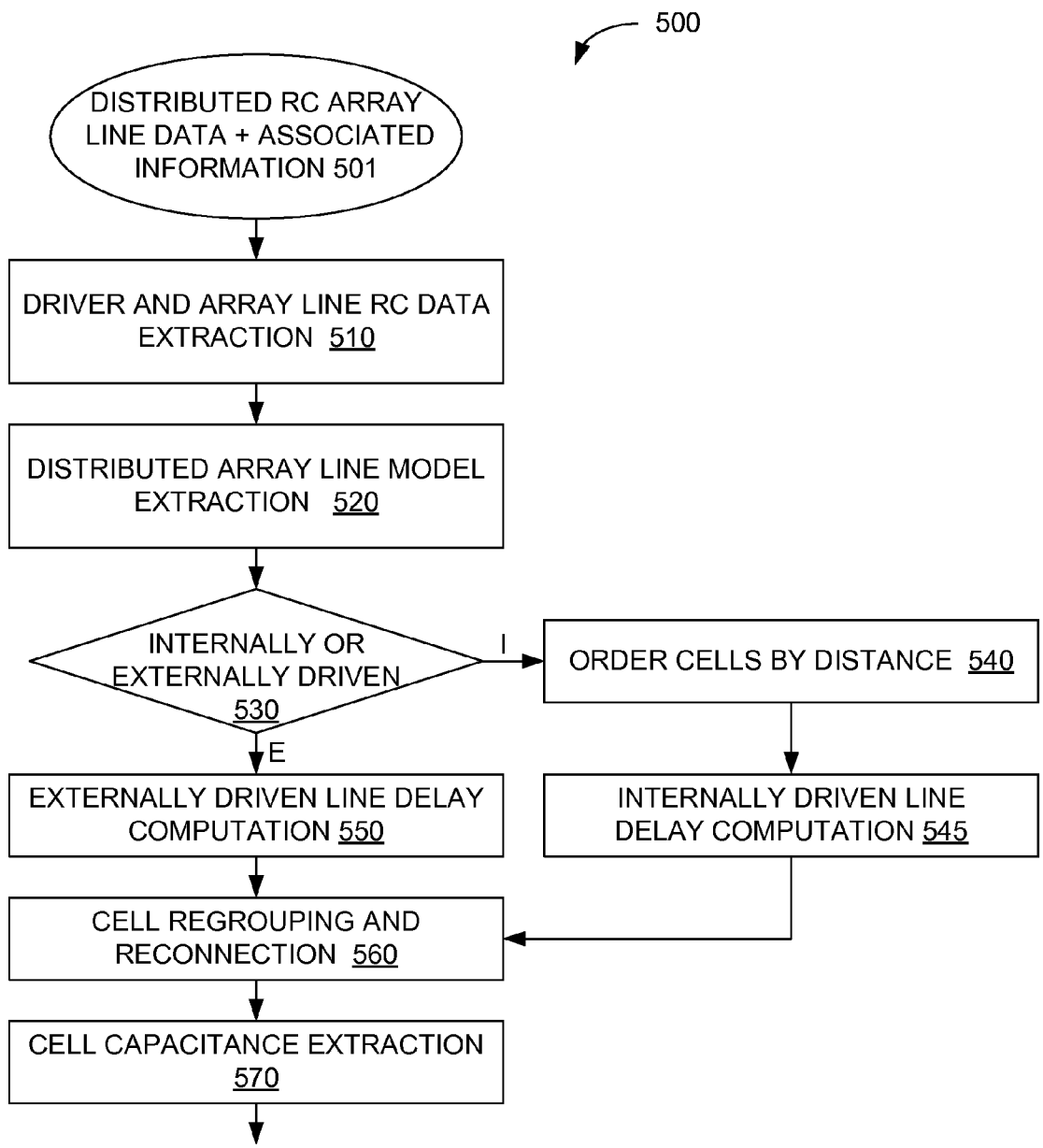
FIG. 5 is an additional flow chart for one embodiment of the present invention.

FIG. 5 provides a flow chart 500 for a method of implementing CELL AND ARRAY LINE OPTIMIZATION 440 in accordance with one embodiment of the present invention. Specifically, RC array line data, including data on resistors and capacitors forming the distributed lines, along with information on connections of the lines to cells and array line drivers (labeled DISTRIBUTED RC ARRAY LINE DATA+ASSOCIATED INFORMATION in FIG. 5, is provided to DRIVER AND ARRAY LINE RC DATA EXTRACTION 510, where the capacitances, the strength of the drivers, the resistances and capacitances of the array line are extracted. Some embodiments of the present invention would also extract inductances of the array lines.

Then, RC reduction techniques such as Krylov subspace and truncated balanced realization, are applied to extract compact models of the distributed RC array lines in DISTRIBUTED RC ARRAY LINE MODEL EXTRACTION 520. In general the optimized models take the form of capacitance and conductance matrices. In some embodiments of the present invention, topologies of distributed bit lines and the corresponding models are stored so that if another distributed bit line has the same topology the model is reused rather than recomputed.

Externally driven array lines and internally driven array lines are treated differently. For internally driven array lines, the cells on the internally driven array lines are ordered by a distance measure from an external circuit in ORDER CELLS BY DISTANCE 540. For example in a memory array, the external circuits could be the sense amps coupled to the internally driven array lines. In some embodiment of the present invention, the distance measure is signal delay from the external circuit to each cell. The delay from the external circuit to each cell can be measured by modeling a signal pulse at the external circuit and measuring the delay to each cell. In another embodiment of the present invention the distance measure is the topological distance of a cell on an array line to the external circuit. Specifically, the topological distance is the number of elements (such as resistors) between the external circuit of the array line and the cell coupled to the array line.

Then, the delay from each cell of an internally driven array line to the external circuit is computed in INTERNALLY DRIVEN LINE DELAY COMPUTATION 545. In one embodiment of the present invention the delay computation assumes a step input voltage at the driver. Furthermore, in some embodiments of the present invention bisection is used to more quickly compute the delay from each cell based on the order of the cells determined in ORDER CELLS BY DISTANCE 540. For example, if the first cell and the fifth cell have the same delay than the second, third, and fourth cell can be assumed to have the same delay and would not need to be computed. For memory arrays, internally driven array line delay can be computed by modeling read cycles.

For externally driven array lines, the delay from the driver of the externally driven array line to each cell on the externally driven array line is computed in EXTERNALLY DRIVEN LINE DELAY COMPUTATION 550. In memory arrays, externally driven array line delays can be computed by modeling cell enable cycles.

Then, in CELL REGROUPING AND RECONNECTING 560, cells on array lines that have approximately equal delays are reconnected to a single node (i.e. sub-array line in FIG. 3). In some embodiments delays that are approximately equal are within a delay difference threshold of each other. The delay difference threshold can be user defined. For example, in some embodiments of the present invention the delay difference threshold is 5 to 10%. Alternatively, in some embodiments of the present invention, a group of cells is reconnected to a single node if the computed delay for the cells differ by not more than a specified relative threshold between any two delays. In many embodiments of the present invention, rather than specifying the relative threshold directly, a user can specify a simulation accuracy level. In a particular embodiment a simulation accuracy level of 3, 4, 5, 6 is equivalent to a relative threshold of 10%, 10%, 8%, and 5%, respectively. In addition in some embodiments of the present invention, the capacitance of the cells are extracted from active cell elements (e.g. access transistors) and added to the array lines in CELL CAPACITANCE EXTRACTION 570. The modified array lines are then provided to PARASITIC ELEMENT OPTIMIZATION 450 (FIG. 4) for continued processing as explained above.

Generally, the present invention is likely to be implemented on a computer as part of an EDA package. The computer programmed in accordance with the invention receives a design of an integrated circuit device. Then, with appropriate parameters from the user, various electric signal propagation characteristics are analyzed.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process described above.

Numerous modifications and adaptations of the embodiments described herein will become apparent to the skilled artisan in view of this disclosure and are encompassed by the scope of the invention.

What is claimed is:

1. A method of optimizing a post-layout array of cells having a plurality of array lines on a computer, the method comprising:
   forming array line models for the array lines of the post-layout array of cells on the computer;
   forming one or more ideal sub-array with cells from the post-layout array of cells on the computer, wherein sub-array lines of the one or more ideal sub-array of cells can be treated as single nodes.

2. The method of claim 1, further comprising detecting a plurality of parasitic capacitors within the post-layout array.

3. The method of claim 2, further comprising optimizing the plurality of parasitic capacitors by replacing each of the parasitic capacitors in the plurality of capacitors with a pair of parasitic capacitors coupled to ground.

4. The method of claim 2, wherein the detecting parasitic capacitors within the post-layout array is controlled by a user definable accuracy level.

5. The method of claim 1, wherein the forming array line models for the array lines of the post-layout array of cells, further comprises:
   extracting a plurality of resistances on the array lines;
   extracting a plurality of capacitances on the array lines;
   extracting capacitances of a driver on each array line; and
   extracting driver strength for the driver on each array line.

6. The method of claim 5, wherein the array line models are derived from the resistances and capacitances using model order reduction.

7. The method of claim 1, wherein each of the array lines is coupled to a plurality of cells and wherein the plurality of array lines include a plurality of internally driven array lines and a plurality of externally driven array lines.

8. The method of claim 7, wherein the forming array line models for the array lines of the post-layout array of cells, further comprises:
   extracting capacitances from each cell on an array line; and
   including the capacitances from each cell on the array line in the array line models.

9. The method of claim 1, wherein the post-layout array of cells is a memory array.

10. A method of optimizing a post-layout array of cells having a plurality of array on a computer, the method comprising:
    forming array line models for the array lines of the post-layout array of cells on the computer;
    forming one or more ideal sub-array with cells from the post-layout array of cells on the computer by:
      ordering the cells on the plurality of internally driven array lines by a distance measure;
      computing a delay from the cells on each internally driven array line to an external circuit coupled to the internally driven array line; and
      computing a delay from a driver of each externally driven array line to each cell on the externally driven array line.

11. The method of claim 10, wherein the forming one or more ideal sub-array with cells from the post-layout array of cells, further comprises regrouping and reconnecting cells on an array line having similar delays to a node on the array line.

12. The method of claim 11, wherein a first delay is similar to a second delay when the first delay differs from the second delay by no more than a relative threshold.

13. The method of claim 12, wherein the relative threshold is derived from a user specified accuracy level.

14. The method of claim 11, wherein the forming one or more ideal sub-array with cells from the post-layout array of cells, further comprises optimizing parasitic elements on the array lines to merge nodes on the array lines.

15. A system for optimizing a post-layout array of cells having a plurality of array lines, the system comprising:
    means for forming array line models for the array lines of the post-layout array of cells, means for forming one or more ideal sub-array with cells from the post-layout array of cells, wherein sub-array lines of the one or more ideal sub-array of cells can be treated as single nodes.

16. The system of claim 15, further comprising means for detecting a plurality of parasitic capacitors within the post-layout array.

17. The system of claim 16, further comprising means for optimizing the plurality of parasitic capacitors by replacing each of the parasitic capacitors in the plurality of capacitors with a pair of parasitic capacitors coupled to ground.

18. The system of claim 15, wherein the means for forming array line models for the array lines of the post-layout array of cells, further comprises:
    means for extracting a plurality of resistances on the array lines;
    means for extracting a plurality of capacitances on the array lines;
    means for extracting capacitances of a driver on each array line; and
    means for extracting driver strength for the driver on each array line.

19. The system of claim 15, wherein each of the array lines is coupled to a plurality of cells and wherein the plurality of array lines include a plurality of internally driven array lines and a plurality of externally driven array lines.

20. The system of claim 19, wherein the means for forming array line models for the array lines of the post-layout array of cells, further comprises:
    means for extracting capacitances from each cell on an array line; and
    means for including the capacitances from each cell on the array line in the array line models.

21. A system for optimizing a post-layout array of cells having a plurality of array lines, the system comprising:
    means for forming array line models for the array lines of the post-layout array of cells;
    means for forming one or more ideal sub-array with cells from the post-layout array of cells further comprising:
      means for ordering the cells on the plurality of internally driven array lines by a distance measure; and
      means for computing a delay from the cells on each internally driven array line to an external circuit coupled to the internally driven array line; and
      means for computing a delay from a driver of each externally driven array line to each cell on the externally driven array line.

22. The system of claim 21, wherein the means for forming one or more ideal sub-array with cells from the post-layout array of cells, further comprises means for regrouping and reconnecting cells on an array line having similar delays to a node on the array line.

23. The system of claim 22, wherein a first delay is similar to a second delay when the first delay differs from the second delay by no more than a relative threshold.

* * * * *